United States Patent
Sufan et al.

(10) Patent No.: US 9,988,712 B2
(45) Date of Patent: Jun. 5, 2018

(54) SUBSTRATE HOLDING DEVICE

(71) Applicant: AIXTRON SE, Herzogenrath (DE)

(72) Inventors: Eduardo Osman Piniero Sufan, Aachen (DE); Daniel Claessens, Aachen (DE); Adam Boyd, Belgium (BE)

(73) Assignee: AIXTRON SE, Herzogenrath (DE)

( * ) Notice: Subject to any disclaimer, the term of this patent is extended or adjusted under 35 U.S.C. 154(b) by 0 days. days.

(21) Appl. No.: 15/529,640

(22) PCT Filed: Nov. 13, 2015

(86) PCT No.: PCT/EP2015/076562
§ 371 (c)(1),
(2) Date: May 25, 2017

(87) PCT Pub. No.: WO2016/083162
PCT Pub. Date: Jun. 2, 2016

(65) Prior Publication Data
US 2017/0260624 A1    Sep. 14, 2017

(30) Foreign Application Priority Data

Nov. 28, 2014 (DE) .......... 10 2014 117 520
Oct. 26, 2015 (DE) .......... 10 2015 118 215

(51) Int. Cl.
*C23C 14/50* (2006.01)
*C23C 16/458* (2006.01)

(52) U.S. Cl.
CPC .......... *C23C 14/50* (2013.01); *C23C 16/4583* (2013.01)

(58) Field of Classification Search
None
See application file for complete search history.

(56) References Cited

U.S. PATENT DOCUMENTS

| 5,645,646 A | 7/1997 | Beinglass et al. |
| 6,840,767 B2 | 1/2005 | Goodman |
| (Continued) | | |

FOREIGN PATENT DOCUMENTS

| DE | 102011055061 A1 | 5/2013 |
| DE | 102012108986 A1 | 3/2014 |

OTHER PUBLICATIONS

International Search Report dated Feb. 8, 2016, from the European Patent Office, for International Patent Application No. PCT/EP2015/076562 (filed Nov. 13, 2015), 5 pages.

(Continued)

*Primary Examiner* — Jethro M Pence
(74) *Attorney, Agent, or Firm* — Ascenda Law Group, PC

(57) ABSTRACT

A device for holding at least one substrate in a process chamber of a CVD or PVD reactor includes a flat upper side on which at least one bearing area for the at least one substrate is located. An outline contour line corresponding to the outline contour of the substrate is flanked by positioning edges for positioning a respective section of an edge of the substrate. The device further includes carrying protrusions projecting from a bearing area base surface of the bearing area that is surrounded by the outline contour line. The carrying protrusions have contact surfaces that are raised in relation to the bearing area base surface, on which contact surfaces the substrate can be placed. In order to improve the temperature homogeneity of the surface of the substrate, each of the carrying protrusions originate from a recess of the bearing area base surface.

11 Claims, 9 Drawing Sheets

(56) References Cited

U.S. PATENT DOCUMENTS

| | | | |
|---|---|---|---|
| 2003/0209326 A1 | 11/2003 | Lee et al. | |
| 2010/0162957 A1* | 7/2010 | Boyd | C23C 16/4583 |
| | | | 118/725 |
| 2013/0109192 A1 | 5/2013 | Hawkins et al. | |
| 2014/0261698 A1* | 9/2014 | Krishnan | C30B 25/12 |
| | | | 137/1 |
| 2014/0287142 A1 | 9/2014 | Boyd et al. | |
| 2015/0315705 A1* | 11/2015 | Kumagai | C23C 16/45544 |
| | | | 216/67 |
| 2016/0333479 A1* | 11/2016 | Boyd | C23C 16/52 |

OTHER PUBLICATIONS

Written Opinion dated Feb. 8, 2016, from the European Patent Office, for International Patent Application No. PCT/EP2015/076562 (filed Nov. 13, 2015), 5 pages.

* cited by examiner

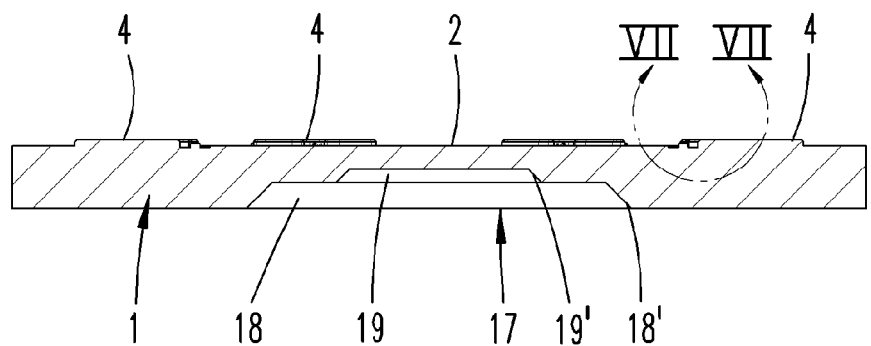
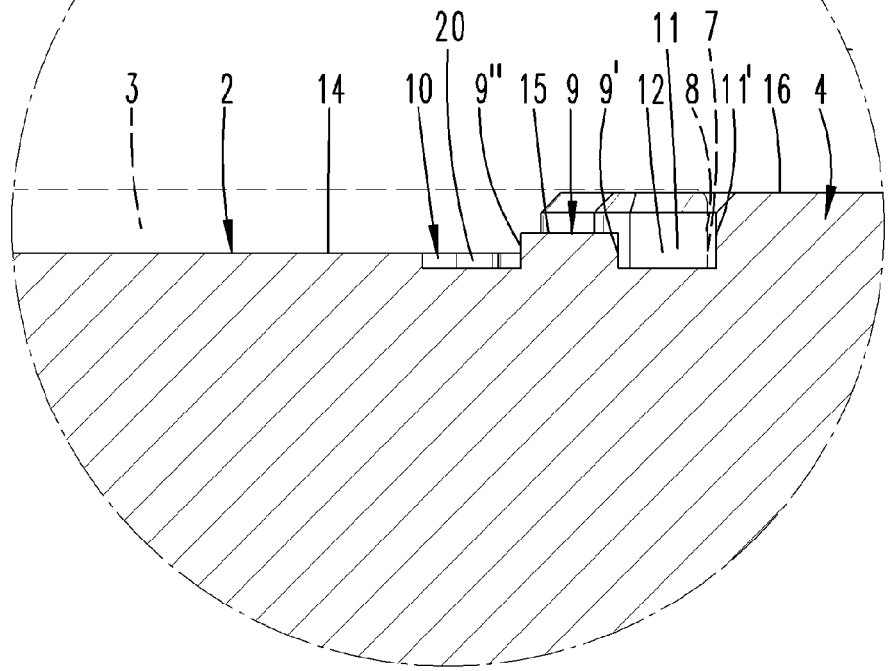

SUBSTRATE HOLDING DEVICE

RELATED APPLICATIONS

This application is a National Stage under 35 USC 371 of and claims priority to International Application No. PCT/EP2015/076562, filed 13 Nov. 2015, which claims the priority benefit of DE Application No. 10 2014 117 520.4, filed 28 Nov. 2014 and DE Application No. 10 2015 118 215.7, filed 26 Oct. 2015.

FIELD OF TECHNOLOGY

The invention relates to a device for holding at least one substrate for use in a process chamber of a CVD or PVD reactor, with a flat upper side on which at least one bearing area for the at least one substrate is located, wherein an outline contour line corresponding to the outline contour of the substrate is flanked by positioning flanks for the positionally fixed contacting of a respective section of an edge of the substrate, and with carrying protrusions projecting from a bearing area base surface of the bearing area that is surrounded by the outline contour line, which have contact surfaces that are raised in relation to the bearing area base surface, on which the substrate can be placed.

PRIOR ART

A device of this kind is previously known from U.S. Pat. No. 5,645,646. The publication discloses a susceptor with a bearing area for receiving a substrate, wherein the bearing area is bordered by a positioning flank, which envelops an outline contour line corresponding to the outline contour of a substrate, so that the substrate can be received by the bearing area with a slight distance between its edge and the positioning flank. Several carrying protrusions project from a bearing area base surface of the bearing area, which supports an area of the lower side of the substrate close to the edge of the substrate, so that the substrate lies hollow over the bearing area base surface.

DE 10 2012 108 986 A1 describes a substrate holder of a CVD device that consists of a flat disk with an upper side and a lower side. The upper side has pocket-like structures, which have bearing areas for one respective perfectly circular substrate. Edge sections of sockets on the upper surface form positioning flanks for fixing the position of a respective one of a plurality of substrates arranged on the upper side of the substrate holder. The edge of the substrates rests on isolated carrying protrusions that border the positioning flank. The section of the carrying protrusion projecting into the bearing surface of the bearing area is surrounded by a trench. The sockets have a triangular outline, and are able to position the substrates in a hexagonal arrangement.

U.S. Pat. No. 6,840,767 B2 and US 2013/0109192 A1 also show a substrate holder with bearing areas and vertical structures arranged in the area of the bearing surfaces of the bearing areas for the point support of the substrate.

The job of a generic substrate holder is to be used as a susceptor in a CVD or PVD coating device. Such coating devices have a reactor with a process chamber, the floor of which consists of the upper side of the substrate holder. The substrate holder is cooled or heated from below to a process temperature. Process gases are introduced into the process chamber through a gas inlet member. In a CVD reactor, the process gases in the gas phase react above the susceptor or on the surface of the susceptor, or on the surfaces of the substrates lying on the susceptor. Surface reactions take place. A layer here forms on the substrate surface. The quality and layer thickness of the layer deposited there depend significantly on the surface temperature of the substrate. For this reason, it is desirable to realize a minimal lateral surface temperature gradient on the substrates. To this end, the substrate is only provided with point support in a generic substrate holder. It rests on a bearing area that has an outline contour line lying only slightly outside of the surface taken up by the substrate. The positioning flanks run at a slight distance along the edge of the substrate, so as to fix the substrate into position on the bearing area in this way. Only the edge of the substrate rests on the carrying protrusions. Contact heat transmission from the susceptor to the substrate takes place via these carrying protrusions. The predominant surface area of the substrate is otherwise hollow, i.e., at a vertical distance above the base surface of the bearing area, so that heat transmission from the base surface of the bearing area to the lower side of the substrate takes place essentially via thermal radiation or convection by way of the carrier gas located in the process chamber. One disadvantage is that the substrate heats up to a slightly greater extent in the area of its contact points on the carrying protrusions than in the remaining area. The surface temperature of the substrate is hence slightly higher in the area of the support points than in the remaining area of the substrate.

SUMMARY OF THE INVENTION

The object of the invention is to take measures with which the temperature homogeneity of the surface temperature of the substrate can be improved.

The object is achieved with the invention indicated in the claims, wherein the subclaims describe not only advantageous further developments of the main claim, but also independent further developments of prior art.

It is initially and essentially proposed that the carrying protrusions project from a depression. The depression can have a flat floor or a curved floor. The floor or curvature apex of the depression defines a depression level. At least three carrying protrusions are arranged in the region of the bearing area, wherein each carrying protrusion projects from a depression, and all depression floors or depression apexes lie on the same depression level. An edge of the depression borders the bearing area base surface, which runs on a base surface level. The bearing area base surface can be a plane. The carrying protrusion can project from the depression with a steep wall, to some extent like a cylinder. However, the carrying protrusion is preferably designed like a curvature. The contact surface of the carrying protrusion or the contact surfaces of the several carrying protrusions lie(s) in a substrate contact level. The base surface level is vertically spaced less apart from the substrate contact level than the depression level. The at least one carrying protrusion can be surrounded by an annular depression. Only one respective carrying protrusion preferably lies in a depression. It can here be provided that the carrying protrusion and the depression surrounding it lie completely inside of the outline contour line. The outline contour line hence also includes the edges of the depressions. However, it is also provided that the outline contour line crosses the carrying protrusions or at least several of the carrying protrusions, and in particular their contact surfaces. The outline contour line then also crosses the depression. The edge of the depression can be spaced apart from a positioning flank. A depression or recess designed as a trench can extend along the positioning flank. The depression that surrounds the carrying protrusion can be part of this trench. The edge of the depression can hence either border the positioning flank or be remote from the positioning flank. In a further development of the invention, the carrying protrusion can also be located in the region between the two adjacent sockets. Such a carrying protrusion can be capable of carrying the marginal edges of two adjacent substrates. The carrying protrusion is then functionally allocated to two adjacent bearing areas, wherein the outline contour lines allocated to the two bearing areas each cross the same contact surface. Such a carrying protrusion is also surrounded by a depression, wherein the depression can have an oval annular shape, and the contact surface is oblong in design, wherein a longitudinal direction of extension by the contact surface extends in the direction of a center of a circular outline contour line. In a preferred embodiment of the invention, the bearing area base surface passes edgelessly over into a rounded wall of the depression. The rounded wall of the depression can have a cross sectional contour that consists of adjoining circular arc sections. The depression can have an annular apex line or apex surface, which passes over into the outer wall of the carrying protrusion without kinks, accompanied by the formation of a cross sectional rounding. The wall of the carrying protrusion can also pass over into the flat contact surface without kinks, also accompanied by the formation of a cross sectional rounding. In a further development of the invention, it is proposed that the carrying protrusions not directly border the positioning flanks, but rather that the carrying protrusions be completely surrounded by a trench. The positioning flanks are spaced apart from the carrying protrusions in the direction of extension of the outline contour line. As a result, the heat flow from the positioning flanks to the carrying protrusions is diminished. This is advantageous in particular when the positioning flanks are the lateral walls of sockets that project from the upper side of the substrate holder. A niche is preferably formed between two directly adjacent positioning flanks, which extend along an outline contour line of the bearing area. The niche can have a niche wall, which adjoins the positioning flank formed by a wall. This wall runs on the edge of the niche, and preferably extends on a semicircular arc line. A semicircular trench section extends between the semicircular arc line of the niche wall and a lateral wall of the carrying protrusion extending along a semicircular arc. The wall of the carrying protrusion pointing toward the niche wall preferably runs on a semicircular arc line. A wall of the carrying protrusion lying opposite this wall of the carrying protrusion also runs on a semicircular arc line, so that the carrier protrusion has essentially an oval outline. The contact surface of the carrying protrusion running in a parallel plane to the floor of the bearing area is intersected by the outline contour line. The preferably circular outline contour line thus runs across the contact surface of the carrying protrusion. Since the edge of the preferably perfectly circular substrate only extends slightly radially inside of the outline contour line of the bearing area, the marginal edge of the substrate also runs over the contact surface of the carrying protrusion. The trench surrounding the carrying protrusion has a floor that runs in a plane. Involved here is a parallel plane to the floor of the bearing area, or a parallel plane to the contact surface. The trench extends with a uniform floor level along the two positioning flanks that flank the niche. As a consequence, the trench has two oblong sections pointing away from each other, which extend nearly over the entire length of the positioning flanks. This measure also helps to diminish the transport of heat from the positioning flanks to the substrate. The positioning flanks preferably do not extend precisely along the outline contour line of the bearing area, i.e., a circular arc line. The positioning flanks can be slightly divergent; they are spaced apart from the outline contour line. The two transitional areas from the niche to the positioning flank should preferably lie on the outline contour line. The base surface of the bearing area is spaced apart vertically in relation to the base surface of the trench. The contact surface of the carrying protrusion is spaced apart relative to the surface of the bearing area, so that the substrate lies hollow.

Located on the lower side of the substrate holder are circular depressions, which are centered around the midpoint of the circular bearing areas. A marginal edge of the depression has a floor that extends on a first depression level. A central region of the depression has a floor that extends on a deeper level.

BRIEF DESCRIPTION OF THE DRAWINGS

Exemplary embodiments of the invention will be explained below based on attached drawings. Shown on:

FIG. 6 is the section according to the VI-VI line on FIG. 2,

FIG. 7 is the magnified VII-VII cutout on FIG. 6,

DESCRIPTION OF EMBODIMENTS

Figure 1:
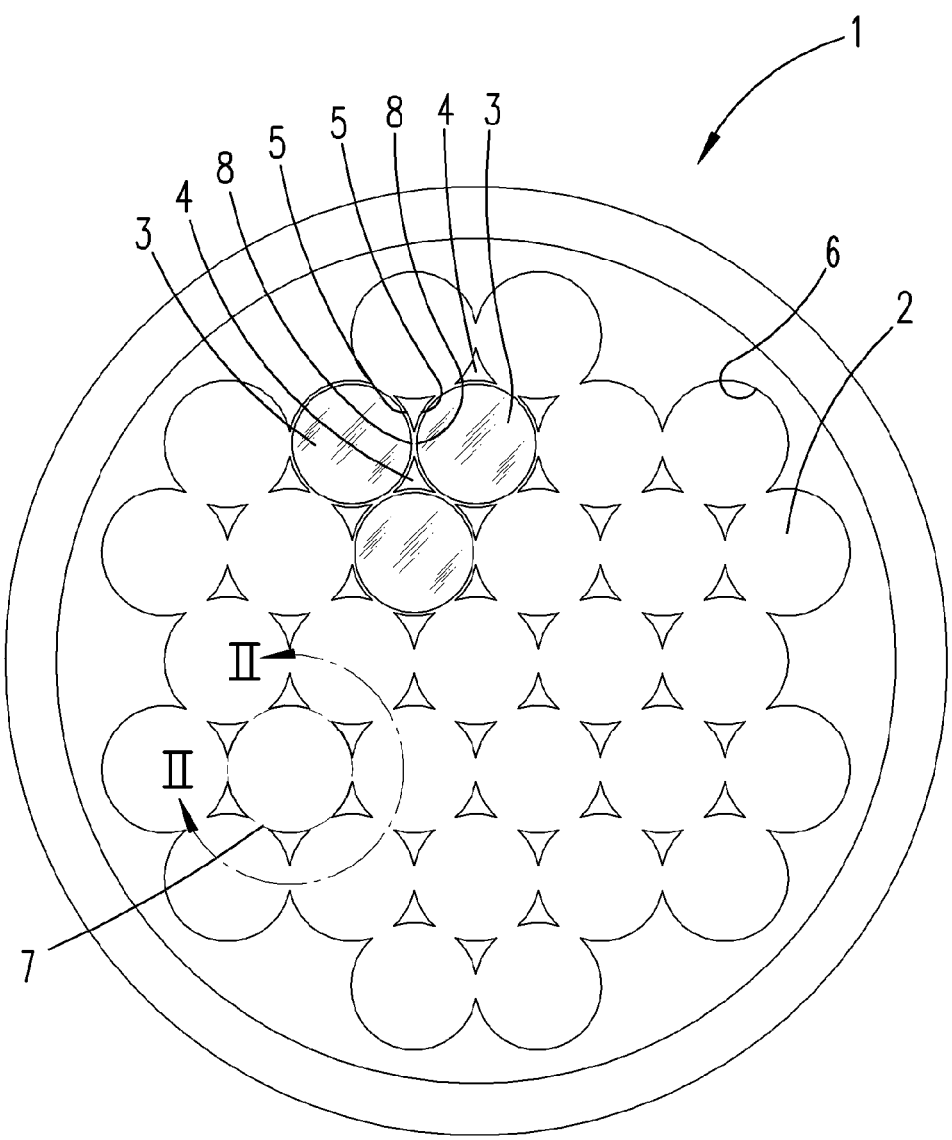
FIG. 1 is a top view of a substrate holder 1.
Figure 2:
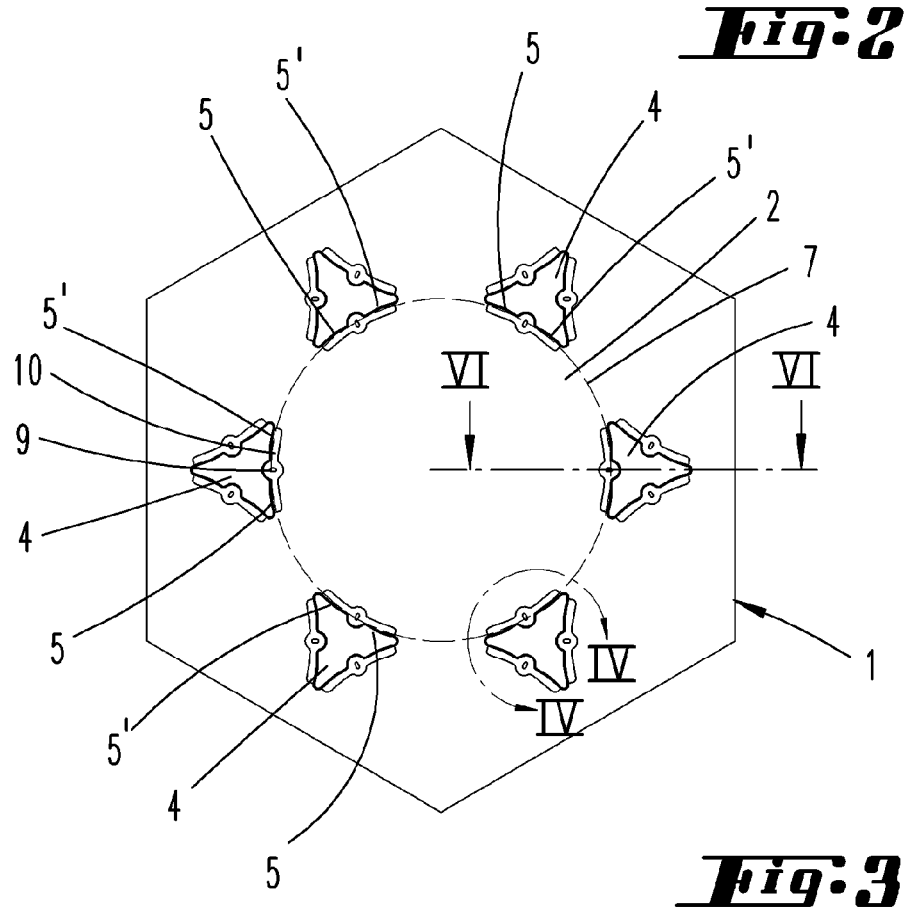
FIG. 2 is the II-II cutout on FIG. 1.
Figure 3:
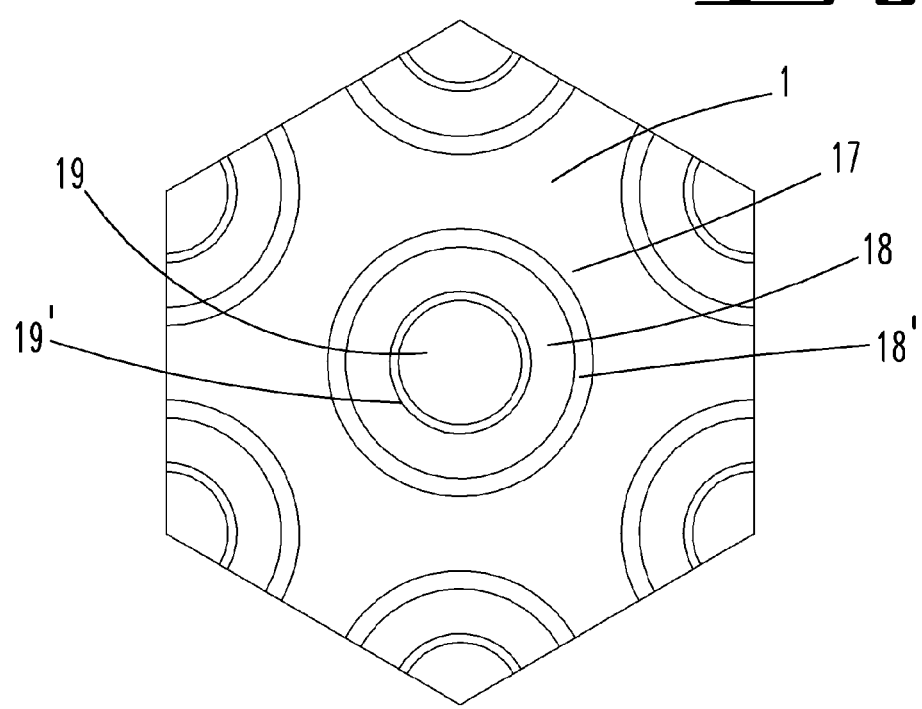
FIG. 3 is a rear view of the cutout according to FIG. 2.
Figure 4:
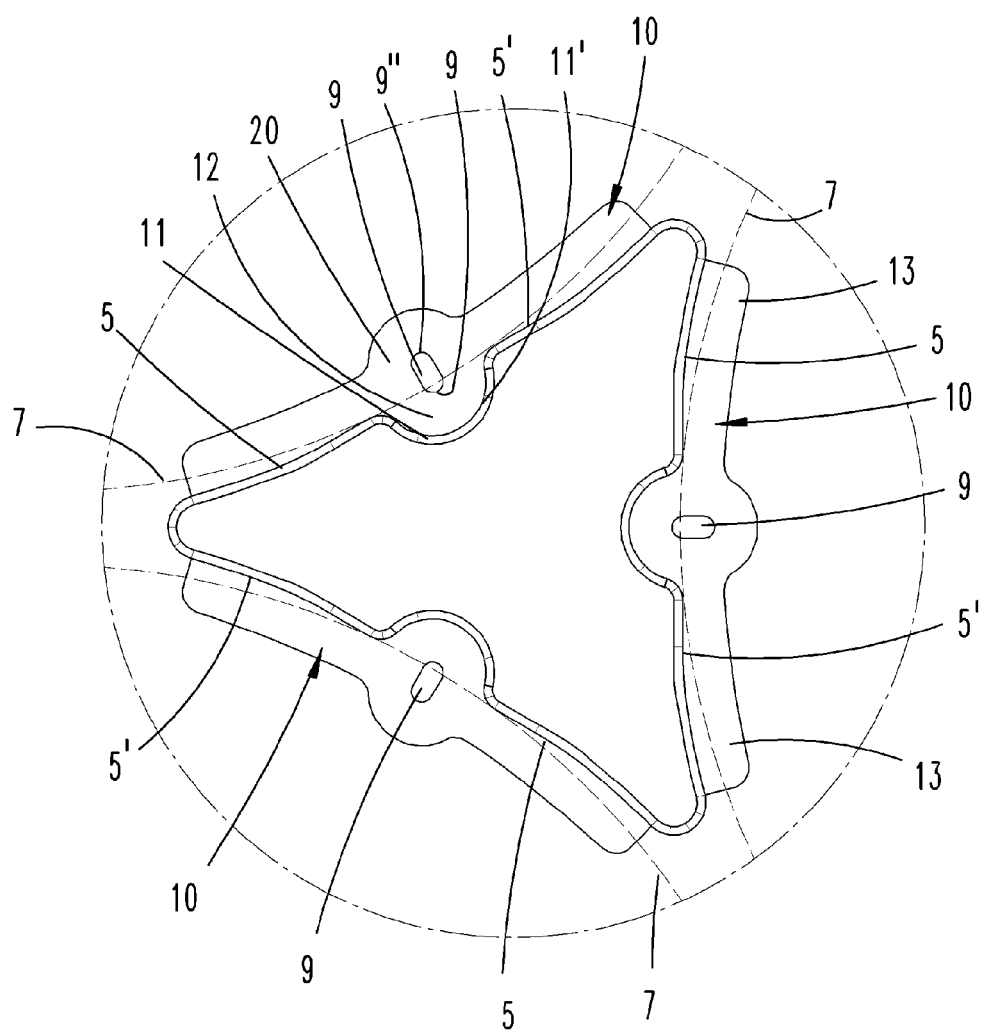
FIG. 4 is the magnified IV-IV cutout on FIG. 2.
Figure 5:
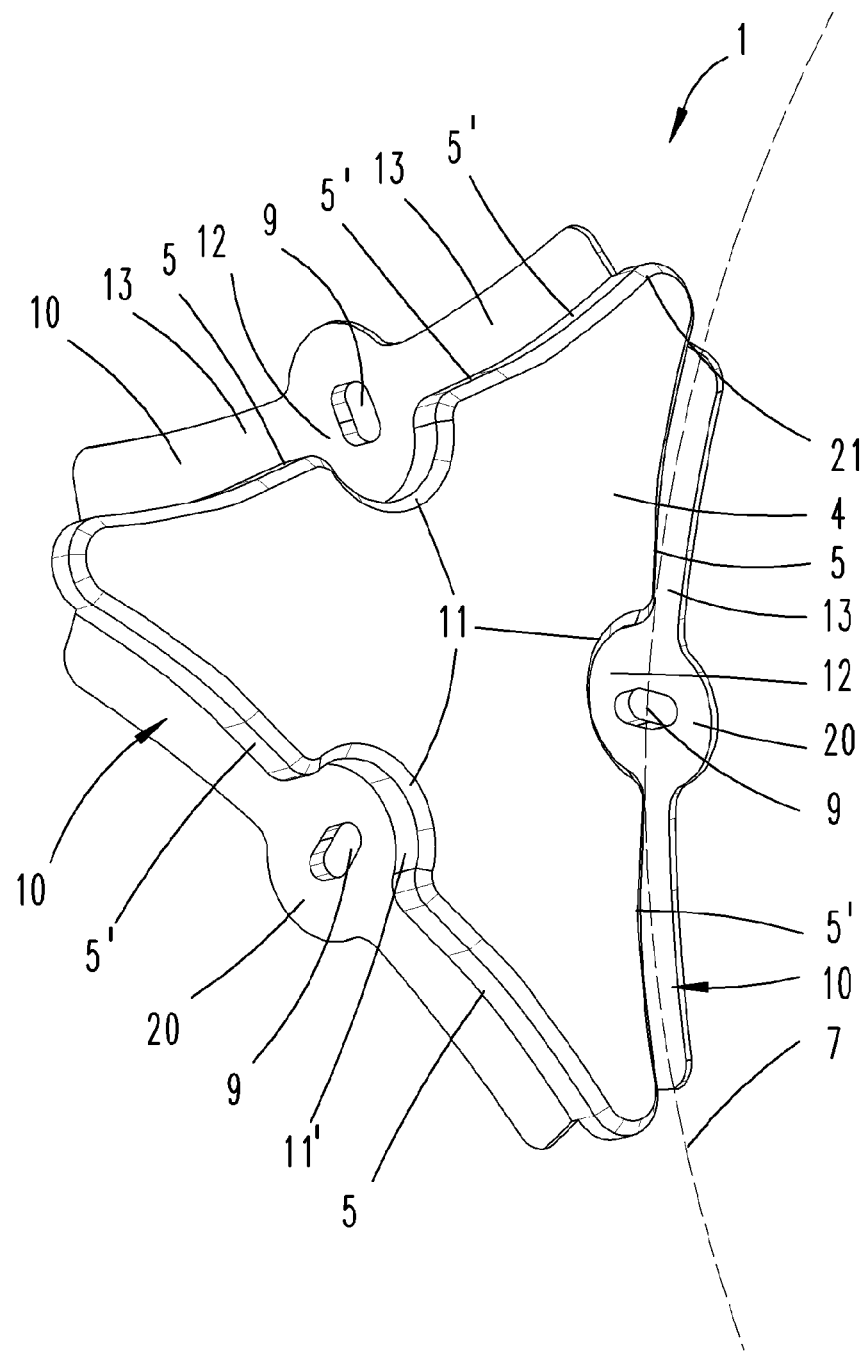
FIG. 5 is a perspective view of the cutout according to FIG. 4.

The substrate holder 1 depicted on the drawings is used as a susceptor in a CVD reactor. A CVD reactor has a housing that is outwardly sealed gastight, as schematically illustrated in DE 10 2011 055 061 A1. Located inside of the housing at a lower height level is a heater, which can be a resistance heater. This heater is used to bring the susceptor 1 arranged above the heater to a surface temperature. Located on the upper side of the susceptor 1 is a plurality of bearing areas 2, each for mounting a circular disk-shaped substrate. Each bearing area 2 is bordered by a total of six roughly triangular sockets 4. Each socket can form three individual positioning flanks 5 or three pairs of positioning flanks 5, 4'. This yields a hexagonal arrangement of circular bearing areas 2, each for accommodating a substrate 3, the edge 8 of which runs along the outline contour line 7 of the respective bearing area 2. As a consequence, a total of six individual positioning flanks 5 or six pairs of positioning flanks 5, 5' each comprised of another socket 4 extend along each outline contour line 7. Longer circular arc-shaped positioning flanks 7 run at the edge of the susceptor (substrate holder). The outline contour line 7 running on a circular arc line encompasses a bearing area for supporting a circular substrate 3. In the exemplary embodiments, the positioning flanks 5, 5' do not follow the progression of the outline contour line 7 precisely. The outline contour line 7 only touches each of the positioning flanks 5, 5' at essentially a tangential location.

The process chamber extends above the upper side of the susceptor 1 occupied by substrates, and its height is lower than the diameter of a substrate 3, and much lower than the diameter of the circular susceptor 1. While the susceptor 1 has a diameter of 30 cm or more, the height of the process chamber measures only 1 to 5 cm.

The cover of the process chamber is formed by a gas inlet member shaped like a showerhead. The gas inlet member has a cooled gas outlet surface pointing toward the process chamber, with a plurality of gas outlet openings arranged like sieves, through which process gases flow into the process chamber. In order to avoid a preliminary pyrolytic decomposition of the process gases, the gas outlet surface of the gas inlet member is actively cooled. This leads to a high vertical temperature gradient in the process chamber, and hence to a high heat flow from the heated surface of the susceptor 1 to the cooled gas outlet surface. The heat flowing off over this heat transfer path must be continuously resupplied by the heating device. This also leads to a high vertical temperature gradient inside of the susceptor 1. Since the sockets 4 that make up the positioning flanks 5, 5' physically comprise a unit with the susceptor 1 and are heated via solid-to-solid heat conduction, there is a tendency for an undesired heat flow to the substrate to arise via the gap between the positioning flank 5, 5' and edge 8 of the substrate 3.

A total of six locations on the edge 8 of the substrate 3 rest on carrying protrusions 9, which project from the upper side of the susceptor 1. As a consequence, the substrate lies hollow over the bearing area base surface 14 of the bearing area 2. Heat transfer from the susceptor 1 to the substrate 3 thus essentially takes place via thermal radiation or convection from the bearing area base surface 14 of the bearing area 2 to the lower side of the substrate 3. A contact heat transfer via solid-to-solid heat conduction only takes place in the region of the carrying protrusions 9 where the marginal edge of the edge 8 of the substrate 3 rests on the contact surfaces 15 of the carrying protrusions 9.

According to the invention, the positioning flanks 5, 5' are spaced apart from the carrying protrusion 9 in a lateral direction, and in particular in a direction of the outline contour line 7, along which the positioning flanks 5, 5' extend.

Two positioning flanks 5, 5' can together form a concavely rounded triangle side of the socket 4. However, the rounded triangle side of the socket 4 can also be comprised of only one positioning flank 5. The radius of curvature for the positioning flanks 5, 5' is slightly larger than the radius of curvature for the outline contour line 7, however. In the exemplary embodiment shown on FIGS. 2 to 7, a niche 11 with an edge running on the semicircular arc is located in the middle of the concavely rounded triangle side. The midpoint of the circle that defines the semicircular arc lies in the carrying protrusion 9. The latter extends from the surface of the bearing area 2 over the outline contour line 7 and into the niche 11. The wall 9' of the carrying protrusion 9 pointing toward the niche runs on a circular arc line. The wall 9'' pointing away from the latter also runs on a semicircular arc line. The wall 11' extending perpendicular to the socket end face 16 runs on a semicircular arc line, and transitions into the positioning flanks 5, 5' that also extend perpendicularly to the socket end face 16.

The carrying protrusion 9 has walls running perpendicular to the contact surface 15. The carrying protrusion 9 thus receives a cylindrical shape, with a roughly oval cylinder base. The cylindrical carrying protrusion 9 projects from the floor of a trench 10 that completely surrounds the carrying protrusion 9. The trench 10 forms a semicircular trench section 12, which comprises the floor of the niche 11. Another semicircular trench section 20 extends beyond the carrying protrusion 9, so that the two respective semicircular trench sections 12, 20 together comprise an annular, oval trench section. The trench section 20 forms a bulge, and extends in a radial direction toward the center of the bearing area 2. The two trench sections 12, 20 form a uniform depression, which completely surrounds the carrying protrusion 9.

The trench section 12, 20 directly surrounding the carrying protrusion 9 adjoins two oblong trench sections 13, which extend along the positioning flanks 5, 5'. The positioning flanks 5, 5' thus project from the floor of the oblong trench sections 13. The oblong trench sections 13 extend up to a rounded corner section 21 of the socket 4.

The niche 11 has a niche wall 11', which continues in a respective one of the two positioning flanks 5, 5', with the formation of a rounding. In the region of these transitional roundings, the outline contour line 7 is tangent to the positioning flank 5, 5'. With increasing distance from the niche 11, the positioning flank 5, 5' becomes spaced apart from the outline contour line 7. The wall 11' of the niche 11 and the positioning flanks 5, 5' run perpendicular to the bearing area base surface 14 or to the base surfaces of the trench 10 or to the socket end face 16. The positioning flanks 5, 5' and the niche wall 11' transition into the socket end face, with the formation of a chamfer. The contact surfaces 15 of the carrying protrusion 9 project over the bearing area base surface 14 by somewhat more than the depth of the trench 10, as measured from the bearing area base surface 14. The socket 4 has a threefold symmetry and three positioning flanks 5, 5' running roughly along one arc line, the middle of which is interrupted by a niche 11, wherein the niche 11 forms a roughly semicircular indentation in the socket 4. The corners of the sockets 4 are rounded.

Located on the lower side of the susceptor 1 is a plurality of circular recesses. This case involves depressions 17 that are centered toward the center of the bearing area 2. A central, deepest depression section 19 transitions into an edge region 18 of the depression, with the formation of an edge flank 19' that runs at an inclination, which in turn transitions into the lower side surface of the susceptor 1, with the formation of an inclined edge section 18'.

In the carrying protrusions 9 shown on FIGS. 4 to 7, the depression 12, 20 completely surrounding the carrying protrusion 9 has a flat floor that runs on a uniform depression level. The flat floor transitions into the oblong trench sections 13. The contact surface 15 lies in a substrate contact level, and is spaced farther apart from the depression level in a vertical direction than from a base surface level, in which the bearing area base surface 14 extends, transitioning into the trench 10 or depression 12, 20 with the formation of a step.

Figure 8:
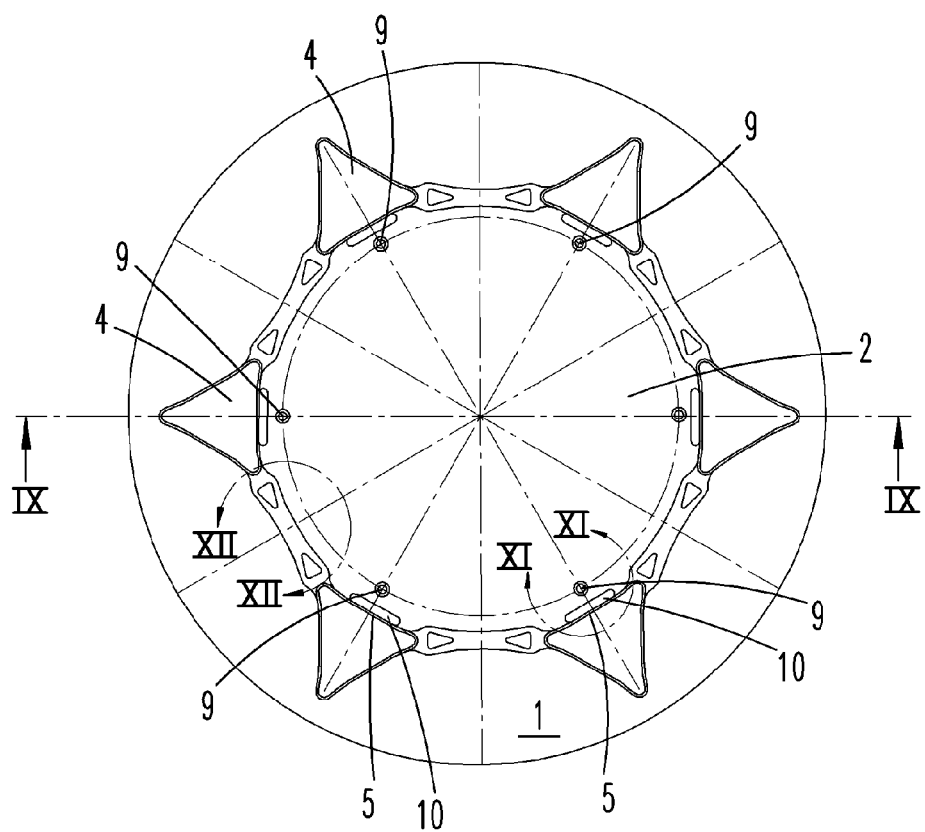
FIG. 8 is an illustration according to FIG. 2 of a second exemplary embodiment.
Figure 9:
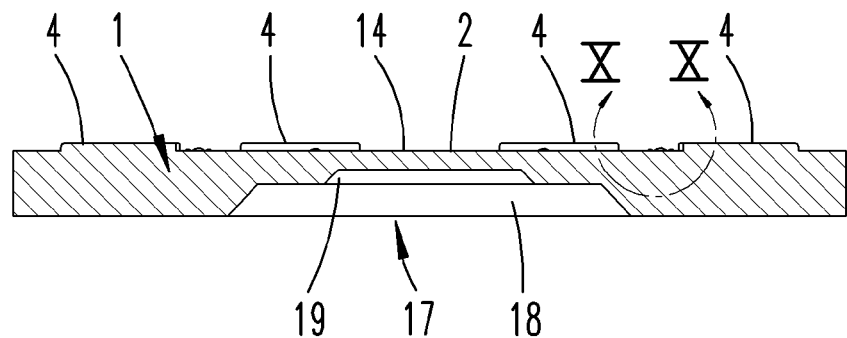
FIG. 9 is the section according to the IX-IX line on FIG. 8.
Figure 10:
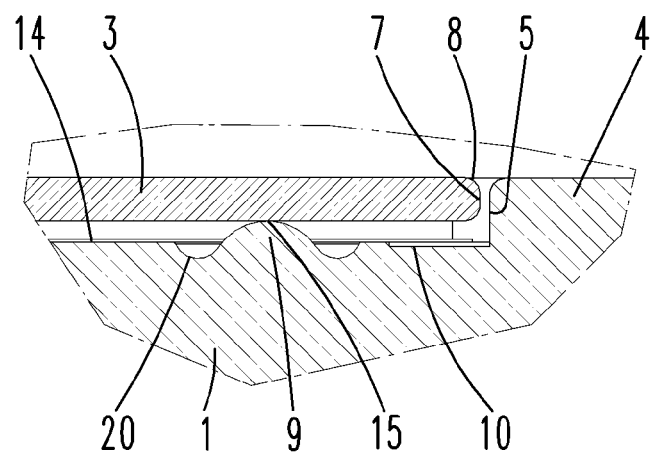
FIG. 10 is a magnified view of detail X on FIG. 9.
Figure 11:
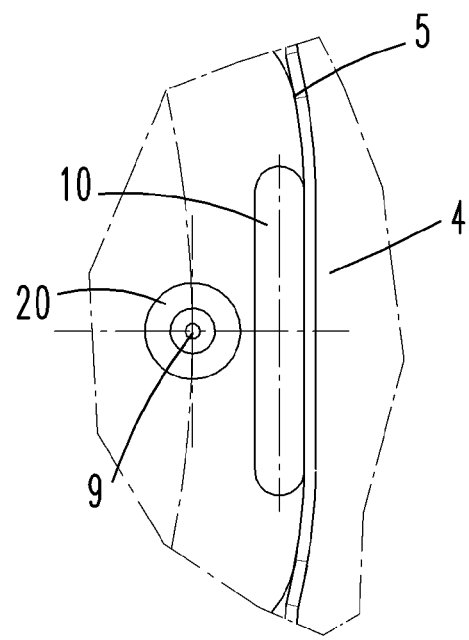
FIG. 11 is a magnified view of the XI-XI cutout on FIG. 8.
Figure 12:
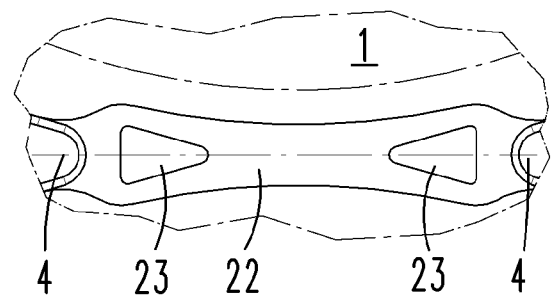
FIG. 12 is a magnified view of the XII-XII cutout on FIG. 8.

FIG. 8 two 12 show a second exemplary embodiment of the invention. Here as well, the sockets 4 have three identically shaped lateral flanks, which each comprise positioning flanks 5. A trench 10 formed by a material recess extends along the positioning flank 5, which is preferably not interrupted by a niche. The trench 10 has an oblong shape, and extends only over the central region of the positioning flank 5. The corners of the socket 4 run on circular arc lines. Recesses 22 are provided between the corners of two adjacent sockets 4.

The outline contour line 7 is a circular arc line. The outline contour line 7 borders a surface that is taken up by a substrate 3 carried by the carrying protrusions 9. The edge 8 of the substrate runs on the outline contour line 7.

The carrying protrusions 9 lie opposite the trenches 10 in the direction of the center of the outline contour line 7, i.e., offset relative to the surface center of the substrate 3 and spaced apart from the trench 10. The carrying protrusions lie roughly at the height of the middle of the trenches 10.

Each of the total of six carrying protrusions 9 of each bearing area 2 is surrounded by a circular depression 20. The width of the annular depression 20 corresponds roughly to the diameter of the carrying protrusion 9 that essentially has a perfectly circular layout. The edge of the depression 20 is located in the bearing area base surface 14, which extends in a base surface level running under a substrate contact level in which lie the contact surfaces 15 of the carrying protrusions 9. The base surface of the depression 20, which consists of an apex line in the exemplary embodiment depicted on FIGS. 8 to 12, runs on a base surface level spaced further apart from the substrate contact level than the base surface level.

The depression 20 has a rounded floor. The cross section of the floor roughly describes a semicircle, so that the depression 20 is designed as the groove surrounding the carrying protrusion 9. The lateral wall of the carrying protrusion 9 transitions without any kinks from the wall of the depression 20 into the contact surface 15, which is a circular surface that extends in a parallel plane to the bearing area base surface 14.

Figure 13:
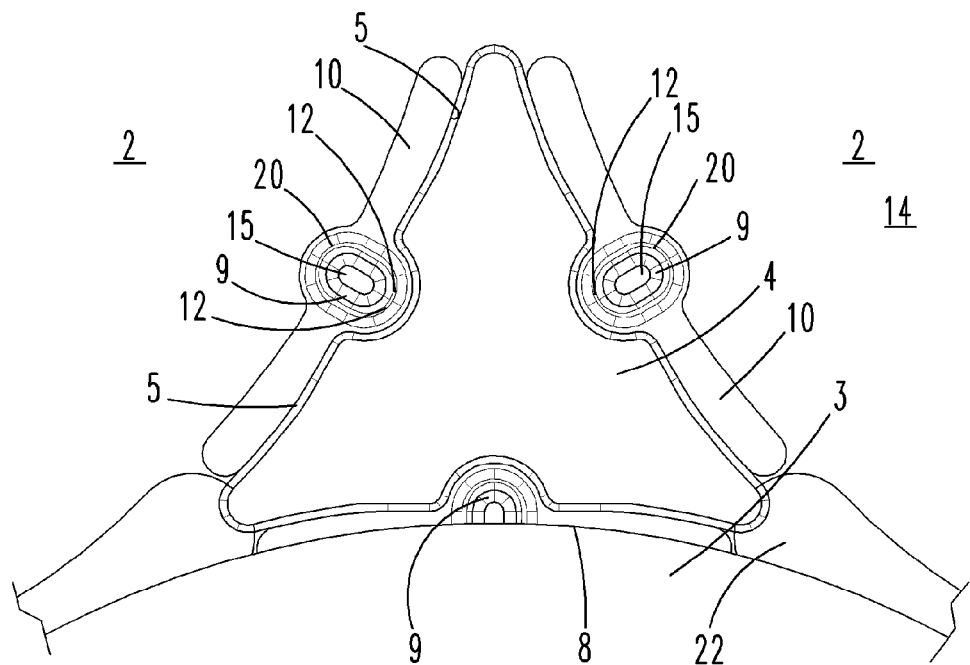
FIG. 13 is a third exemplary embodiment of the invention in an illustration according to FIG. 4.

In the third exemplary embodiment shown on FIG. 13, the depression 20 is located in the region of a trench 10, as in the first exemplary embodiment, and extends until into a niche 11 between two positioning flanks 5, 5'. As opposed to the first exemplary embodiment, the base surface of the depression 20, 12 that annularly surrounds the carrying protrusion 9 here does not run in a plane, but rather has rounded walls that transition into an oval apex line or apex surface. The outer wall of the depression 20, can transition into the bearing area base surface 14 with the formation of an edge, but also with the formation of a rounding.

The edge 8 of the substrate 3 running on the outline contour line 7 crosses the contact surface 15.

The second exemplary embodiment shown on FIGS. 8 to 12 has oblong depressions 22 between the corner regions of the socket 4, which regionally extend under the outline contour line 7. Additional depressions 23 can also be situated there, so that the depression extending between the corner regions of the socket 4 has two different levels.

Figure 14:
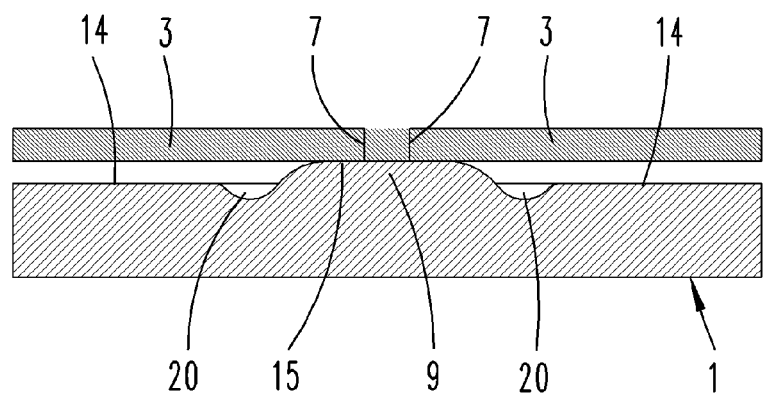
FIG. 14 is a fourth exemplary embodiment of the invention.

The fourth exemplary embodiment shown on FIG. 14 presents a carrying protrusion 9, which can be situated in a region between the corners of the socket 4. This oval carrying protrusion 9 has a contact surface 15, which can be crossed by two outline contour lines 7 of adjacent bearing areas 2. As a consequence, the contact surface 15 of the carrying protrusion 9 is able to carry the edges of two substrates 3. In this exemplary embodiment as well, the lateral walls of the carrying protrusion 9 and the depression 20 that projects from the carrying protrusion 9 are rounded. As evident from FIG. 14, the outer edge of the depression 20 is comprised of a rounding, which transitions without any kinks into a rounding that forms the apex region of the depression 20. This rounding passes over into an oppositely curved rounding, which forms the upper lateral wall region of the carrying protrusion 9. The latter rounding transitions without any kinks into the contact surface 15.

The above statements serve to explain the inventions encompassed by the application overall, which each also independently further develop the prior art at least by way of the following feature combinations.

A device, characterized in that the carrying protrusions 9 project from a depression 20 of the bearing area base surface 14.

A device, characterized in that a respective carrying protrusion 9 is completely surrounded by a depression 20, whose depression floor or depression apex lies on a depression level, and which transitions into the bearing area base surface 14 lying on a base surface level, with the formation of a step or a rounding, wherein a substrate contact level in which the contact surface 15 extends lies vertically closer to the base surface level than to the depression level.

A device, characterized in that the carrying protrusion 9 extends as a kind of cylinder or as a kind of outward bulge from the depression floor or depression apex up to the contact surface 15.

A device, characterized in that the carrying protrusion 9 and the edge of the depression 20 surrounding the carrying protrusion 9 lie inside of the bearing area 2 bordered by the outline contour line 7, without the outline contour line 7 crossing the contact surface 15.

A device, characterized by a recess in the bearing area base surface 14 that runs along the positioning flanks 5, 5' and forms a trench 10.

A device, characterized in that the depression 20 is a section of the trench 10.

A device, characterized by a niche 11 situated between two adjacent positioning flanks 5, 5'.

A device, characterized in that a trench section 12 extends between a lateral wall 11' of the niche 11 and a lateral wall 9' of the carrying protrusion 9.

A device, characterized in that the niche 11 is semicircular as viewed from the top.

A device, characterized in that the carrying protrusion 9 has two opposing semicircular lateral walls 9', 9".

A device, characterized in that the carrying protrusion 9 has an essentially flat contact surface 15, over which the outline contour line 7 runs.

A device, characterized in that elongated trench sections 13 extend along the positioning flanks 5, 5'.

All disclosed features (taken separately, but also in combination with each other) are essential to the invention. The disclosure of the application hereby also includes the disclosure content of the accompanying/attached priority documents (copy of preliminary application) in its entirety, further with the purpose of also incorporating features in these documents into claims of the present application. The features in the subclaims characterize independent inventive further developments of prior art, in particular so as to initiate partial applications based upon these claims.

REFERENCE LIST

1 Substrate holder
2 Bearing area
3 Substrate
4 Socket
5 Positioning flank
5' Positioning flank
6 Positioning flank
7 Outline contour line
8 Edge of substrate 9 Carrying protrusion
10 Trench
11 Niche
11' Wall, lateral wall
12 Trench section
13 Trench section
14 Bearing area base surface
15 Contact surface
16 Socket end face
17 Depression
18 Edge region
18' Edge flank
19 Depression section
19' Edge flank
20 Trench section/depression
21 Corner section
22 Recess
23 Recess

The invention claimed is:

1. A device for holding a substrate in a process chamber of a chemical vapor deposition (CVD) or physical vapor deposition (PVD) reactor, the device comprising:

positioning flanks (5, 5') configured to position respective sections of an edge (8) of the substrate (3), wherein the positioning flanks (5, 5') surround a bearing area base surface (14) of the device which extends on a base surface level; and a plurality of carrying protrusions (9), wherein each of the carrying protrusions (9) projects from and is completely surrounded by a depression (12, 20) of the bearing area base surface (14) and each of the carrying protrusions (9) has a contact surface (15) that is raised in relation to the bearing area base surface (14), wherein the plurality of contact surfaces (15), located at a substrate contact level, are collectively configured to support the substrate (3), wherein a floor or apex of the each of the depressions (12, 20) is located at a depression level, the depression level being spaced farther apart from the substrate contact level in a vertical direction than the base surface level, and wherein for each of the depressions (12, 20), the floor or apex of the depression (12, 20) transitions without kinks into an outer wall of a corresponding carrying protrusion (9) via a first cross sectional rounding, which in turn transitions without kinks into the contact surface (15) of the corresponding carrying protrusion (9) via a second cross sectional rounding.

2. The device of claim 1, wherein for at least one of the carrying protrusions (9), the carrying protrusion (9) extends as a bulge from the floor or apex of a corresponding depression (12, 20) up to the contact surface (15) of the carrying protrusion (9).

3. The device of claim 1, wherein for at least one of the carrying protrusions (9), a portion of the carrying protrusion (9) and a portion of the depression (20) surrounding the carrying protrusion (9) lie inside of the bearing area (2) bordered by an outline contour line (7) which corresponds to an outline contour of the substrate (3).

4. The device of claim 1, further comprising a trench (10) located in the bearing area base surface (14) that runs along two of the positioning flanks (5, 5') that are located adjacent to one another.

5. The device of claim 4, wherein at least one of the depressions (12, 20) forms a portion of the trench (10).

6. The device of claim 1, further comprising a niche (11) situated between two of the positioning flanks (5, 5') that are located adjacent to one another.

7. The device of claim 6, wherein for at least one of the depressions (12, 20), the depression (12, 20) comprises a trench section (12) that extends between a lateral wall (11') of the niche (11) and a lateral wall (9') of the carrying protrusion (9) corresponding to the depression (12, 20).

8. The device of claim 6, wherein the niche (11) has a semicircular outline when viewed from above.

9. The device of claim 1, wherein for at least one of the carrying protrusions (9), the carrying protrusion (9) has two opposing semicircular lateral walls (9', 9").

10. The device of claim 1, wherein for at least one of the carrying protrusions (9), the carrying protrusion (9) lies between two adjacent sockets (4) of the device.

11. The device of claim 10, further comprising an oblong depression (22) that extends between the two adjacent sockets (4).

* * * * *